LOW VOLTAGE SEMI-CONDUCTOR REFERENCE DIODE

Filed March 31, 1965 2 Sheets-Sheet 1

Albert N. Lambert
Billy B. Williams
INVENTORS

BY John D. Graham
ATTORNEY

Albert N. Lambert
Billy B. Williams
INVENTORS
BY John G. Graham
ATTORNEY

United States Patent Office 3,341,750
Patented Sept. 12, 1967

3,341,750
LOW VOLTAGE SEMI-CONDUCTOR REFERENCE DIODE
Albert Neal Lambert and Billy Bruce Williams, Richardson, Tex., assignors to Texas Instruments Incorporated, Dallas, Tex., a corporation of Delaware
Filed Mar. 31, 1965, Ser. No. 444,316
2 Claims. (Cl. 317—234)

ABSTRACT OF THE DISCLOSURE

Disclosed is a diode having two highly doped regions of one type conductivity separated by a third region of opposite type conductivity. An ohmic contact is made to the third region and to one of the highly doped regions, and another ohmic contact is made to the other highly doped region.

This invention relates to electronic components, and in particular to semiconductor diode devices.

A diode is a passive electrical device characterized by a low forward-bias resistance and a high reverse-bias resistance. The reverse-bias resistance of a diode is dependent on the voltage drop across the diode. Because of this characteristic, a reverse-biased diode can be advantageously used as a voltage reference device.

The resistance characteristics also make diodes useful is switching circuits. The switching time of a diode becomes very important in high speed switching applications. One major factor in determining the switching speed of a semiconductor diode is the presence and quantity of minority current carriers near the diode junction region when the diode bias is changed from forward to reverse. After switching the bias of a diode from forward to reverse, a current will flow through the diode until the minority carriers cross the diode junction or re-combine with holes or electrons.

An object of this invention is to provide a semiconductor diode with unique reverse-bias characteristics. Another object is to provide a diode which may be advantageously used as a low-voltage reference device. Still another object is to provide a diode especially useful in high speed switching circuits.

These and other objects and features of the invention will become more readily apparent from the following detailed description and appended claims when considered in conjunction with the accompanying drawings, in which:

Figures 1, 2:
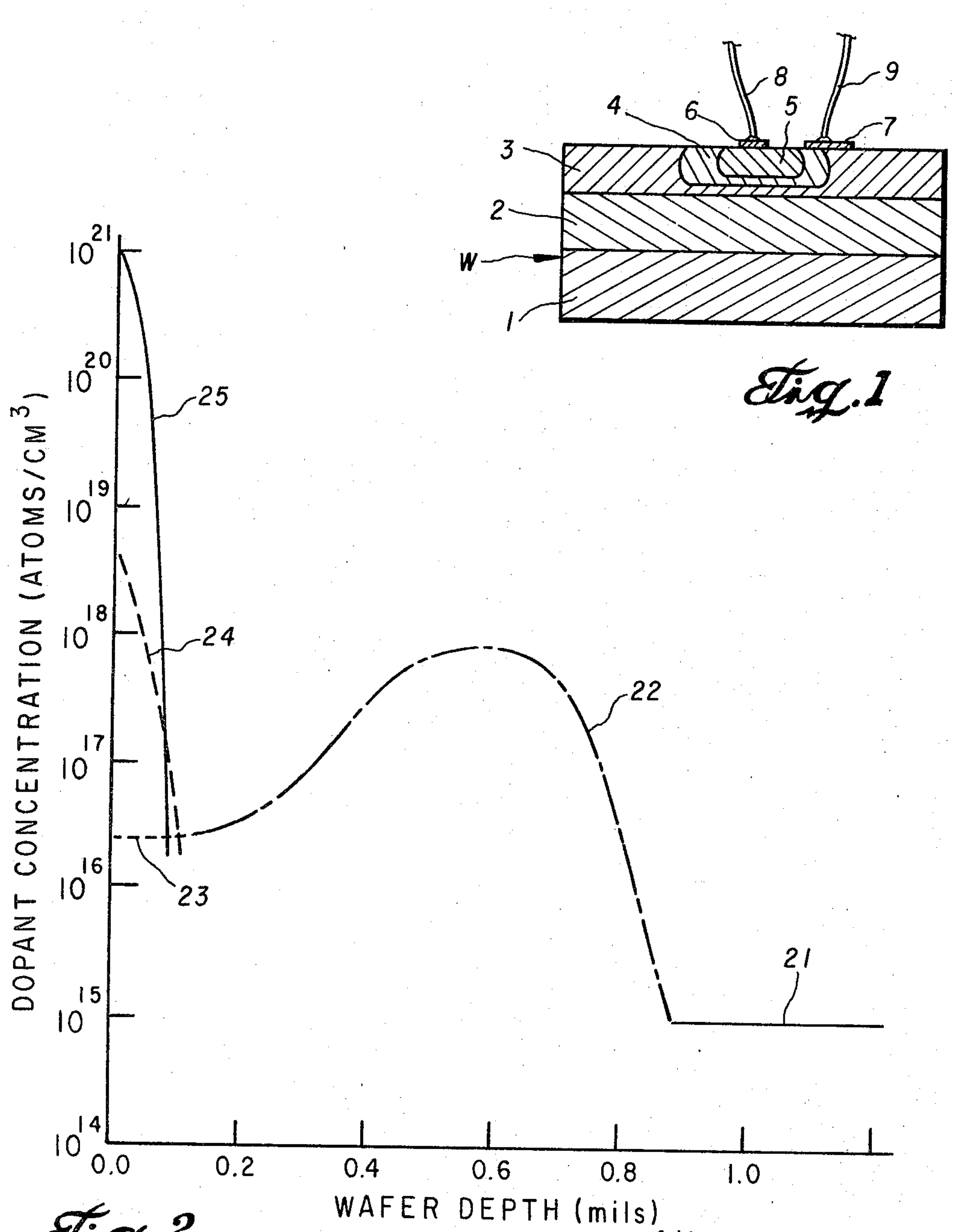
FIGURE 1 is a cross-sectional view of a preferred embodiment of the invention.
FIGURE 2 is a plot of dopant concentration (atoms per cubic centimeter) versus wafer depth (mils)

In accordance with the invention, a diode has two highly doped regions of one type conductivity separated by a third region of opposite conductivity. An ohmic contact is made to the third region ond to one of the highly doped regions, and another ohmic contact is made to the other highly doped region. Referring now to FIGURE 1, a preferred embodiment, the semiconductor wafer W includes a substrate 1 of one conductivity type, a highly doped epitaxial layer 2 of opposite conductivity type, an epitaxial layer 3 also of the opposite conductivity type, a region 4 of the first conductivity type formed in the layer 3, and a highly doped region 5 of the opposite conductivity type formed entirely within the region 4 and defining a thin layer in the region 4 separating the region 5 and the portion of the layer 3 underlying the region 4. The ohmic lead 8 is attached to the ohmic contact 6 on the region 5, and the ohmic lead 9 is attached to the ohmic contact 7 which is common to the region 4 and the epitaxial layer 3.

FIGURE 2 shows the dopant concentrations in one construction of the preferred embodiment illustrated in FIGURE 1. The substrate 1 is P-type silicon with a uniform P-type dopant concentration of $10^{15}$ atoms/cm.$^3$ as illustrated by the curve 21. The epitaxial layer 2 is about 0.77 mil thick and has an N-type dopant concentration depicted by the curve 22. The curve 23 is the initial N-type dopant concentration of the layer 3 which is about 0.12 mil thick. The region 4, diffused in the layer 3, is about 0.108 mil in thickness and has a P-type dopant concentration shown by the curve 24. The curve 25 is the N-type dopant concentration of the highly doped region 5. The region 5 is about 0.097 mil thick. Thus, the thin layer defined in the region 4 separating the region 5 and the layer 3 is about 0.011 mil thick.

Figure 3:
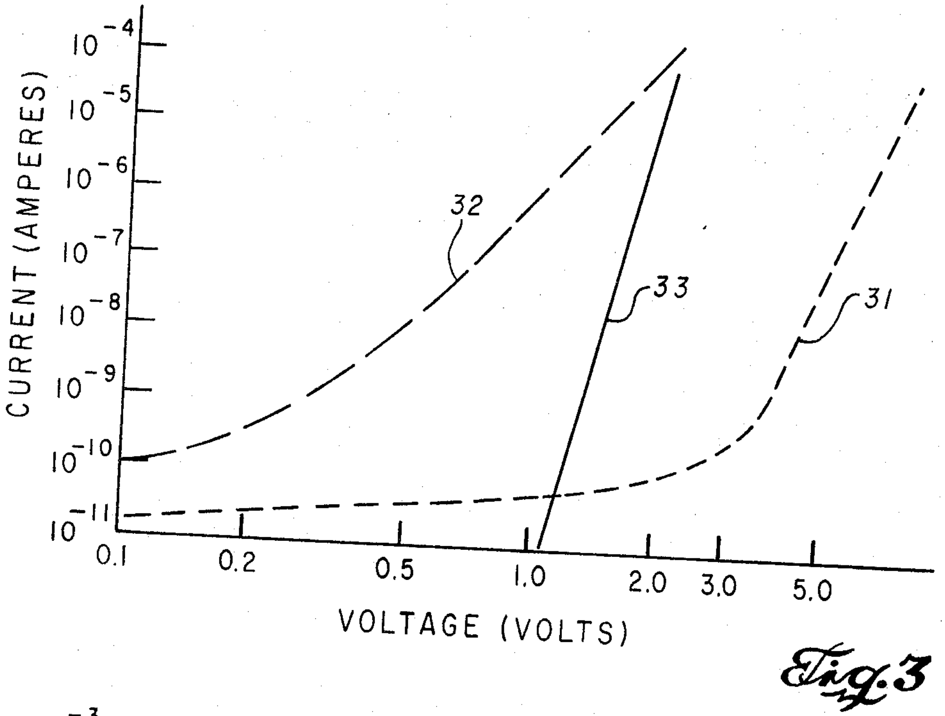
FIGURE 3 is a log-log plot of current (amperes) versus voltage (volts) for a typical diode of this invention and two conventional diodes.

FIGURE 3 is a log-log plot of current versus voltage which illustrates the unique reverse-bias characteristics obtained with the invention. The curves 31 and 32 are typical for reverse-biased Zener and alloy reference diodes, respectively, while the curve 33 is typical for a device of this invention. The curve 33 has a steep current gradient. The current can vary from $10^{-10}$ ampere to $10^{-8}$ ampere, for example, and the voltage will change only slightly (from 1.2 volts to 1.4 volts). Thus, the device represented by the curve 33 can be effectively used in the one nanoampere ($10^{-9}$ ampere) current range as a 1.3 volt reference device. The current gradients expressed by the curve 31 and the curve 32 are appreciably less. Consequently, at 1.3 volts substantially larger changes in the voltage occur with changes in current.

Figure 4:
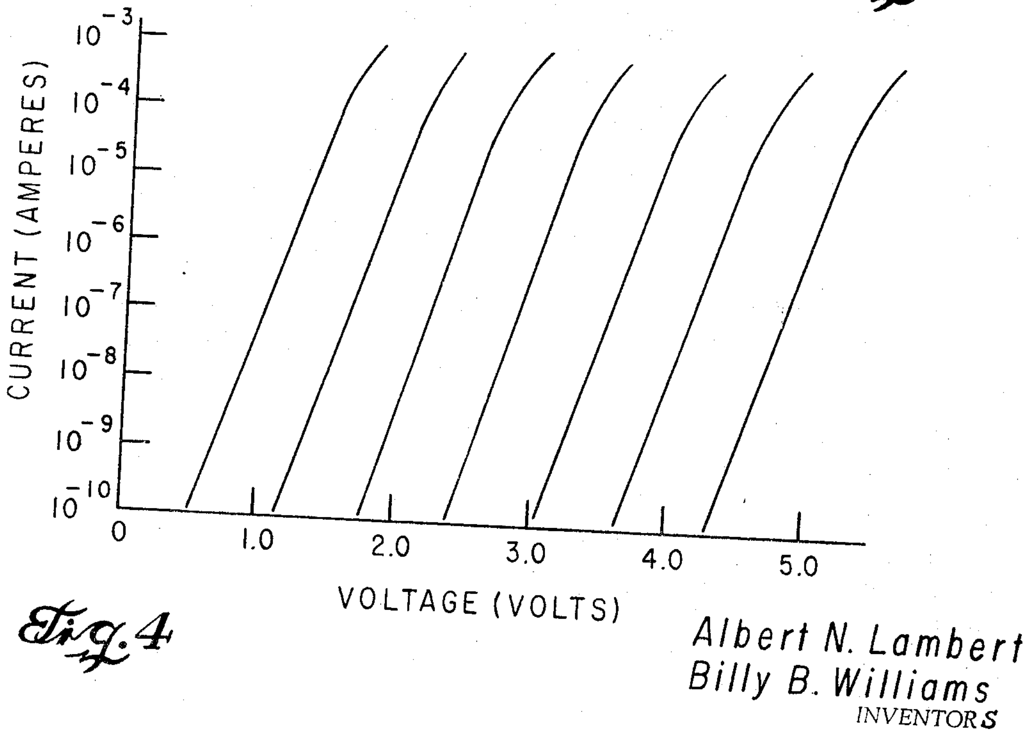
FIGURE 4 is a semilog plot of current (amperes) versus reverse-bias voltage (volts) for several diodes of this invention.

FIGURE 4 illustrates a family of curves for devices made in accordance with the invention but with varying dopant concentrations and dimensions. In the one nanoampere current range, a voltage reference of from 0.6 volt to 4.5 volts can be obtained. It is evident from the curve slopes that in higher and lower current ranges the devices can be advantageously used for voltage reference purposes.

As seen in the above-described preferred embodiment, the diode of this invention has two highly-doped regions of one type conductivity separated by a thin region of opposite type conductivity. By having three regions instead of two regions as in the conventional diode, the quantity of minority current carriers, with the device forward biased, is reduced. Consequently, the switching time of the diode is very fast. For one device with a 10 milliamp forward to 3 volt reverse switching condition, the switching time is approximately 1 nanosecond. Because of this switching speed, the diode is especially useful in high speed switching applications.

While this invention has been described with reference to a particular embodiment, this description is not meant to be construed in a limiting sense. It will be quite obvious to one skilled in the art that various adaptions, variations and modifications could be employed without departing from the spirit and scope of the invention as defined by the appended claims.

What is claimed is:

1. A semiconductor diode comprising a substrate having a P-type dopant concentration of about $10^{15}$ atoms per cubic centimeter; a first epitaxial layer on said substrate, said first layer being about 0.77 mil thick and having an N-type dopant concentration varying from about $10^{15}$ atoms per cubic centimeter at the substrate interface to a concentration between $10^{16}$ and $10^{17}$ atoms per cubic centimeter at the opposite face of said layer with a maximum concentration in excess of $10^{17}$ atoms per cubic centimeter within said layer; a second epitaxial layer on said first epitaxial layer, said second epitaxial layer being about 0.12 mil thick and having an initial N-type dopant concentration between $10^{16}$ and $10^{17}$ atoms per cubic centimeter; a first region formed in said second layer, said first region being about 0.11 mil thick and having a diffused P-type dopant concentration decreasing from a maximum value in excess of $10^{18}$ atoms per cubic centimeter; a second region formed in said first region, said second region being about 0.10 mil thick and having an N-type dopant concentration decreasing from a maximum value in excess of $10^{20}$ atoms per cubic centimeter; an ohmic contact to said second region; and an ohmic contact to said first region and said second layer.

2. A semiconductor diode comprising a substrate having a P-type dopant concentration of about $10^{15}$ atoms per cubic centimeter; a first epitaxial layer on said substrate, said first layer having an N-type dopant concentration varying from about $10^{15}$ atoms per cubic centimeter at the substrate interface to a concentration between $10^{16}$ and $10^{17}$ atoms per cubic centimeter at the opposite face of said layer with a maximum concentration in excess of $10^{17}$ atoms per cubic centimeter within said layer; a second epitaxial layer on said first epitaxial layer, said second epitaxial layer having an initial N-type dopant concentration between $10^{16}$ and $10^{17}$ atoms per cubic centimeter; a first region formed in said second layer and having a diffused P-type dopant concentration decreasing from a maximum value in excess of $10^{18}$ atoms per cubic centimeter; a second region formed in said first region and having an N-type dopant concentration decreasing from a maximum value in excess of $10^{20}$ atoms per cubic centimeter; an ohmic contact to said second region; and an ohmic contact to said first region and said second layer.

References Cited

UNITED STATES PATENTS

| | | | |
|---|---|---|---|
| 3,015,048 | 12/1961 | Noyce | 317—235 |
| 3,040,188 | 6/1962 | Gaertner et al. | 317—234 |
| 3,210,620 | 10/1065 | Lin | 317—235 |
| 3,226,609 | 12/1965 | Palmer | 317—235 |
| 3,278,853 | 10/1966 | Lin | 317—235 |

JOHN W. HUCKERT, *Primary Examiner.*

R. F. POLISSACK, *Assistant Examiner.*